US007265459B2

(12) United States Patent
Sibrai et al.

(10) Patent No.: US 7,265,459 B2
(45) Date of Patent: Sep. 4, 2007

(54) HIGH Q LINEAR CONTROLLED VARIABLE CAPACITOR

(75) Inventors: Andreas Sibrai, Krottendorf (AT); Josef Niederl, Klogenfurt (AT)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 434 days.

(21) Appl. No.: 10/764,920

(22) Filed: Jan. 26, 2004

(65) Prior Publication Data

US 2005/0152092 A1 Jul. 14, 2005

(30) Foreign Application Priority Data

Jan. 14, 2004 (EP) ................... 04368005

(51) Int. Cl.
- H02M 3/06 (2006.01)
- H02M 3/18 (2006.01)
- H01J 19/82 (2006.01)

(52) U.S. Cl. ................... 307/109; 307/110; 327/532
(58) Field of Classification Search ................ 307/109, 307/110; 327/532
See application file for complete search history.

(56) References Cited

U.S. PATENT DOCUMENTS

| 4,449,141 | A |   | 5/1984  | Sato et al. |         |
|-----------|---|---|---------|-------------|---------|
| 4,456,917 | A |   | 6/1984  | Sato et al. |         |
| 5,235,335 | A |   | 8/1993  | Hester et al. | 341/172 |
| 5,514,999 | A |   | 5/1996  | Koifman et al. |       |
| 5,949,156 | A | * | 9/1999  | Groover     | 307/109 |
| 6,013,958 | A | * | 1/2000  | Aytur       | 307/109 |
| 6,184,594 | B1 | * | 2/2001 | Kushnarenko | 307/109 |
| 6,285,095 | B1 | * | 9/2001 | Becker et al. | 307/125 |
| 6,356,135 | B1 |   | 3/2002 | Rastegar    |         |
| 6,437,724 | B1 | * | 8/2002 | Nagaraj     | 341/159 |
| 6,476,682 | B1 |   | 11/2002 | Cole et al. | 331/176 |
| 6,577,180 | B2 | * | 6/2003 | Liu         | 327/532 |
| 6,882,064 | B2 | * | 4/2005 | Glenn       | 307/109 |
| 6,937,098 | B2 |   | 8/2005 | Meusburger et al. |  |
| 2003/0045069 | A1 | | 3/2003 | Gilgen et al. |      |
| 2004/0256917 | A1 | * | 12/2004 | Glenn     | 307/109 |

(Continued)

FOREIGN PATENT DOCUMENTS

| EP | 0431887 A | 12/1990 |
| EP | 0431887 A | 6/1991 |

(Continued)

OTHER PUBLICATIONS

Abstract/Zusammen fassung/Abrege 04368005.7.

(Continued)

Primary Examiner—Michael Sherry
Assistant Examiner—Michael Rutland-Wallis
(74) Attorney, Agent, or Firm—Saile Ackerman LLC; Stephen B. Ackerman (57) ABSTRACT

A voltage controlled variable capacitor, formed of a larger number of fixed capacitor segments and a corresponding number of switching elements, linearly switches on each switching element, one after the other. Several techniques are disclosed to have only a minimum number of switching stages being in the active mode-of-change at any one time with a minimum overlap. The arrangement achieves a nearly linear change of capacitance versus tuning voltage change, while resulting in high Q-factor due to the low RDSon and high RDSoff of the fully switched stages.

20 Claims, 11 Drawing Sheets

U.S. PATENT DOCUMENTS

2005/0151574 A1* 7/2005 Lin .......................... 327/333
2005/0151575 A1* 7/2005 Sibrai et al. ................ 327/334

FOREIGN PATENT DOCUMENTS

| | | |
|---|---|---|
| JP | 62076801 | 4/1987 |
| WO | WO 01/06637 A | 1/2001 |
| WO | WO 01/06637 A | 1/2001 |

OTHER PUBLICATIONS

"RF-CMOS Oscillators with Switched Tuning", by Kral et al., IEEE 1998 Custom Integrated Circuits Conf., pp. 555-558.

Co-pending U.S. Patent D5-03-005B, U.S. Appl. No. 10/764,914, filed Jan. 26, 2004, "High Q Linear Controlled Variable Capacitor Using Translinear Amplifier", assigned to the same assignees.

* cited by examiner

*VarCap*

HIGH Q LINEAR CONTROLLED VARIABLE CAPACITOR

RELATED PATENT APPLICATION

This application is related to U.S. patent application Ser. No. 10/764,914 filed concurrently herewith on Jan. 26, 2004 and U.S. patent application Ser. No. 10/676,919 filed on Oct. 1, 2003 and assigned to the same assignee as the present invention.

BACKGROUND OF THE INVENTION (1) Field of the Invention

The invention relates to a voltage controlled variable capacitor, and more particularly, to a variable capacitor, formed of a larger number of fixed capacitor segments and a corresponding number of switching elements, typically integrated with the capacitance controlling functions on an integrated semiconductor circuit.

(2) Description of the Prior Art

Figure 1A:
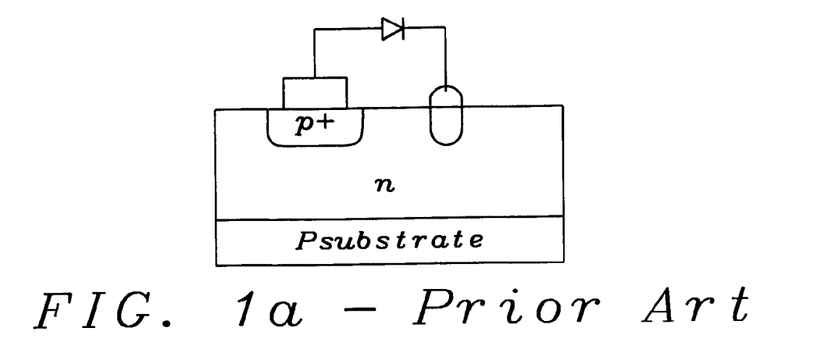
FIG. 1a (Prior Art) shows a simplified structure of a varactor diode.
Figure 1B:
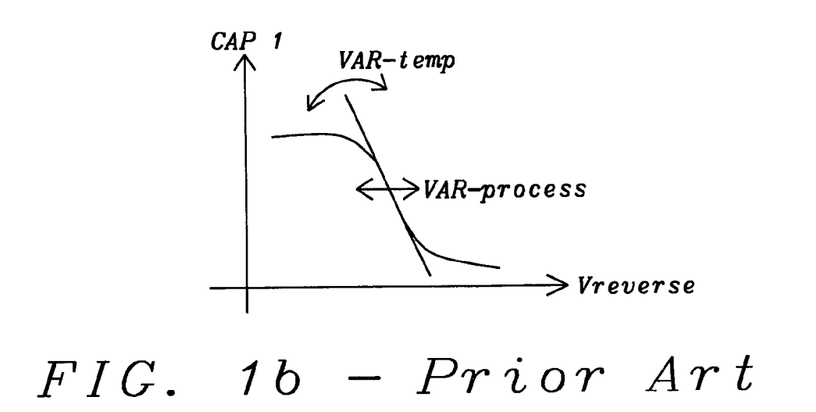
FIG. 1b (Prior Art) shows the relation of the capacitor over tuning voltage change and shows the effects of temperature and process variation.

One example of a voltage-controlled capacitor is a varactor diode. When a reverse voltage is applied to a PN junction, it creates a depletion region, essentially devoid of carriers, which behaves as the dielectric of a capacitor. The depletion region increases as reverse voltage across it increases; thus the junction capacitance will decrease as the voltage across the PN junction increases. However the characteristics are non-linear and are widely temperature and process dependent. There is also a significant leakage current problem. Varactor diodes must be operated below the junction breakdown voltage. The varactor diode is sometimes called a varicap. FIG. 1a shows the principle of a varactor diode; FIG. 1b shows the control voltage to capacitance characteristics of said varactor diode and demonstrates the effects of temperature and process variations.

Figure 2A:
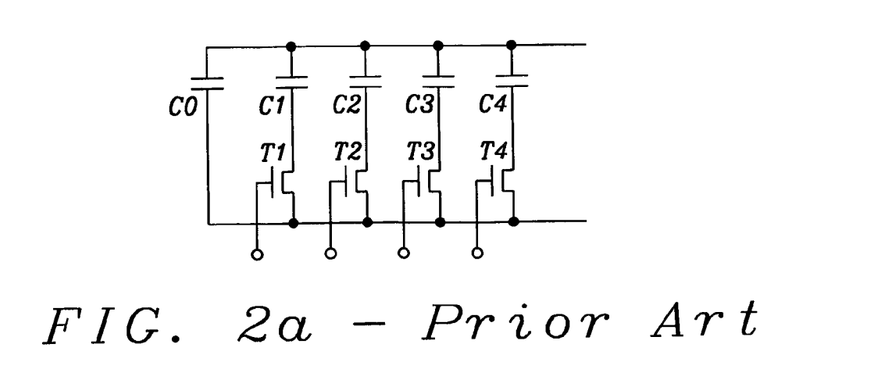
FIG. 2a, 2b and 2c (Prior Art) shows a principal circuit of a switched capacitor chain and the relation of the capacitor over tuning voltage change.
Figure 2B:
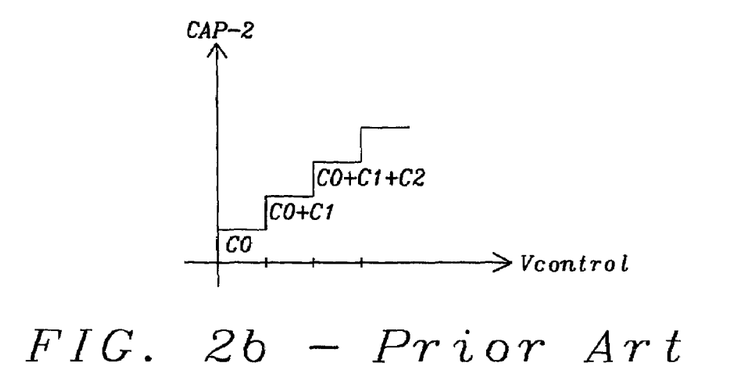
Figure 2C:
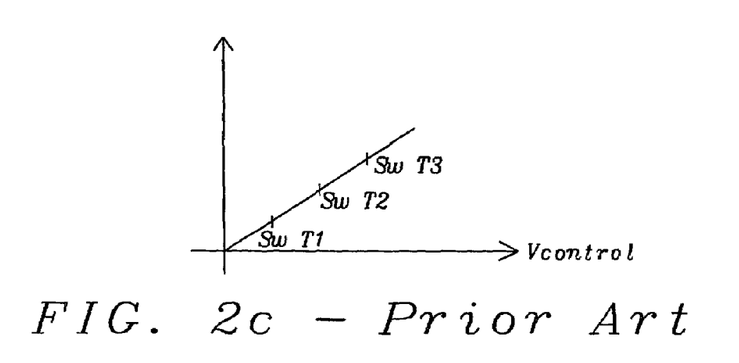

Another example is a switched capacitor chain, where capacitors are switched in parallel one after the other, thus increasing the capacitance step by step. The capacitors, when made of metal or polycarbonate structures, are far less sensitive to temperature and process deviations. FIG. 2a shows the basic circuit concept. However, as is demonstrated in FIG. 2b, there is only a "step-wise linear" capacitance change over the control voltage, when the transistors T1 to T4 of FIG. 2a switch at the points Sw T1 to Sw T4 as shown in FIG. 2c. In addition the switching of the individual capacitors causes switching noise ("spikes") on the common circuit rails. Furthermore, while the switching transistor is kept in a flat switching ramp to smooth the switching steps, the transistor's resistance causes a Q-factor problem.

U.S. Pat. No. 6,356,135 (to Rastegar) describes an electronically trimable capacitor having a plurality of branch circuits, each including a capacitor which may be selectively controlled by a switch to contribute or not to the net capacitance exhibited by the trimable capacitor. Operation of the switches is under direction of digital instruction.

U.S. Pat. No. 5,514,999 (to Koifman, et al.) shows a differential switched capacitor circuit, comprising: multiple switched capacitor stages, coupled in a chain.

U.S. Pat. Nos. 4,449,141 and 4,456,917 (to Sato, et al.) disclose a variable capacitor comprising a plurality of variable capacitor elements each having depletion layer control sections and a capacity reading section formed on a semiconductor substrate so that the capacity appearing at each capacity reading section varies in response to the bias voltage applied to the depletion layer control sections.

SUMMARY OF THE INVENTION

A principal object of the invention is to control the capacitance of a variable capacitor in a linear mode through a tuning voltage. A fundamental requirement is to achieve a high Q-factor at the same time.

In accordance with the objectives of this invention, a circuit to implement a voltage controlled variable capacitor, operating in a linear mode and maintaining high Q-factor is achieved. The variable capacitor arrangement comprises a set of small individual capacitors. Switching devices, in series to each of said capacitors, connect said capacitors in parallel, one after the other in a linear mode. An essential concept of the invention is the introduction of a linear control function that will drive said switching devices steadily from off-state to on-state. In accordance with the objectives of this invention, the disclosed invention adds circuits and methods to linearize the capacitance change and to minimize the effect of parasitic resistance in the capacitor switching elements, which would degrade the Q-factor.

Within said set of small capacitors, one capacitor after the other is switched in parallel to change the total sum of capacitance. To achieve a linear capacitance change, said capacitors are not switched on one by one in digital steps, however each capacitor is switched on partially in a sliding operation, starting at low value (0% of its capacitance) and ending with the fully switched on capacitor (100% of its capacitance). To achieve said sliding switch operation, a typical implementation uses FET-transistors as switching device, one per capacitor. The switching operation of such FET-type transistor can be divided into three phases: the fully-switched-off phase (said FET transistor's drain-source-resistance RDS is very high), a steady ramp-up/ramp-down phase or steady transition phase (that is: said FET transistor's resistance RDS is changing between very high resistance and very low resistance in a linear and steady mode) and the fully-switched-on phase (said FET transistor's drain-source-resistance RDS is very low). By thoroughly controlling such switching device within said linear and steady ramp-up/ramp-down phase, the capacitor in series with said switching device is partially switched in parallel with a well-controlled proportion between 0% and 100%.

The terms "steady ramp-up/ramp-down phase" or "steady transition phase" (and "steady ramp-up/ramp-down area" or "steady transition area") are used as synonyms throughout this document. The term "area" in this context is used to express the "operating range"—the term "phase" is used to express the "operation in process" within said operating area.

One key point to obtain a high Q-factor is to drive the capacitor-switching element, typically a FET-transistor, into minimum RDSon or maximum RDSoff, as the parasitic resistance of RDS is the reason for Q-factor degradation. Another key point to obtain highest possible Q-factor: only very few transistors (ideally only one) should be in the steady transition phase, i.e. in RDS changing-mode, all others are either fully switched on or fully switched off. To achieve this goal, an individual threshold level for each capacitor switching stage defines the point where, in relation to the tuning voltage, each of said capacitor switching stages switches from the off to the on state. Overlapping of neighboring switching stages cannot be completely eliminated, but overlapping is kept to a minimum by selecting appropriate threshold parameters.

In a first solution according to the objectives of this invention, the linear control voltage to drive said capacitor-switching elements is derived from a circuit, implementing, for example, a chain of resistors, where each voltage point within said resistor chain controls one of said capacitor-switching elements. One endpoint of said resistor chain follows the tuning voltage input; all other voltage points follow a fraction of said tuning voltage.

In a second solution according to the objectives of this invention, a voltage follower circuit is introduced into the circuit of the first solution.

Furthermore, in a third solution according to the objectives of this invention, introduces a set of operational amplifiers, one for each capacitor-switching device. A resistor chain, or a similar circuit, produces a series of threshold points and each of said operational amplifiers compares the tuning voltage input with its dedicated threshold voltage. While said switching transistor is kept within its active switching range (RDS changing mode) the resistance of the transistor linearly follows the input difference of said operational amplifier. Said operational amplifiers give all freedom in circuit dimensioning to decide on the preferred threshold values and steepness of the switching ramp.

There are various techniques to generate a set of reference values defining the threshold points for each of said amplifier stages. And there are various techniques to provide a tuning voltage, dedicated for the voltage controlled capacitance change, to all of said amplifier stages.

In accordance with the objectives of this invention, a set of individual capacitors is implemented. Such capacitors could, be discrete metal or polymer capacitors on a common planar carrier or they could be integrated on a semiconductor substrate. The switching device is typically a FET transistor, which could be for example a P-channel or N-channel junction FET or a P-MOS or N-MOS FET.

The series resistance of said active switching device degrades the Q-factor of the variable capacitor. With the proper choice of threshold and steepness of the switching ramp, the number of said switching devices being active concurrently can be kept to a minimum.

In accordance with the objectives of this invention, a method to control the capacitance of a variable capacitor in a linear mode through a tuning voltage and to achieve a high Q-factor at the same time generate, is achieved. One method is to switch a variable number of capacitors in parallel, where only very few (ideally only one) are in the active transition phase of being switched on in a continuous mode. All other capacitors of a larger number of capacitors are either already fully switched on or are still complete switched off. One key method is to control the switching function for each of said switching devices, when said switching device is in its dedicated active working area in a linear mode. A further method amplifies, by the means of an operational amplifier, the difference of the capacitance tuning voltage and said threshold voltage of each amplifier stage, producing the linear control signal for said steady progressing switching operation. Another method generates a set of reference values, one for each of said amplifier stages. A tuning voltage is supplied to the circuit, dedicated for the voltage controlled capacitance change, to all of said amplifier stages.

BRIEF DESCRIPTION OF THE DRAWINGS

In the accompanying drawings, forming a material part of this description, there is shown:

FIG. 10a visualizes the overlapping switching operations of the individual stages of FIG. 9a.

FIG. 10b shows the RDSon resistance versus the transistor's gate voltage for a single capacitor switching stage of FIG. 9a.

FIG. 11 shows, in more detail, the gate voltage versus tuning voltage relation for the series of capacitor switching stages, according to FIG. 9a.

FIG. 12a shows the capacitance versus tuning voltage for the series of capacitor switching stages, according to FIG. 9a.

FIG. 12b shows the Q-factor versus tuning voltage for the series of capacitor switching stages, according to FIG. 9a.

FIG. 14 visualizes the overlapping switching operations of just 2 stages of the circuit according to FIG. 9a.

DESCRIPTION OF THE PREFERRED EMBODIMENTS

The objectives of this invention are to control the capacitance of a variable capacitor in a linear mode through a tuning voltage. A fundamental requirement is to achieve a high Q-factor at the same time.

The variable capacitor arrangement implements a set of small capacitors, a set of capacitor switching stages and a circuit to provide a tuning voltage. To achieve the goal of high Q-factor, the disclosed invention adds circuits and methods to linearize the capacitance change and to minimize the effect of parasitic resistance in the capacitor switching elements, which would degrade the Q-factor.

Within said set of small capacitors, one capacitor after the other is switched in parallel to change the total sum of capacitance. To achieve a linear capacitance change, said capacitors are not switched on one by one in digital steps, however each capacitor is switched on partially in a sliding operation, starting at low value (0% of its capacitance) and ending with the fully switched on capacitor (100% of its capacitance). To achieve said sliding switch operation, a typical implementation uses FET-transistors as switching device, one per capacitor. The switching operation of such FET-type transistor can be divided into three phases: the fully-switched-off phase (said FET transistor's drain-source-resistance RDS is very high), a steady ramp-up/ramp-down phase or steady transition phase (that is: said FET transistor's resistance RDS is changing between very high resistance and very low resistance in a linear and steady mode) and the fully-switched-on phase (said FET transistor's drain-source-resistance RDS is very low). By thoroughly controlling such switching device within said linear and steady ramp-up/ramp-down phase, the capacitor in series with said switching device is partially switched in parallel with a well-controlled proportion between 0% and 100%.

The terms "steady ramp-up/ramp-down phase" or "steady transition phase" (and "steady ramp-up/ramp-down area" or "steady transition area") are used as synonyms throughout this document. The term "area" in this context is used to express the "operating range"—the term "phase" is used to express the "operation in process" within said operating area.

Figure 3:
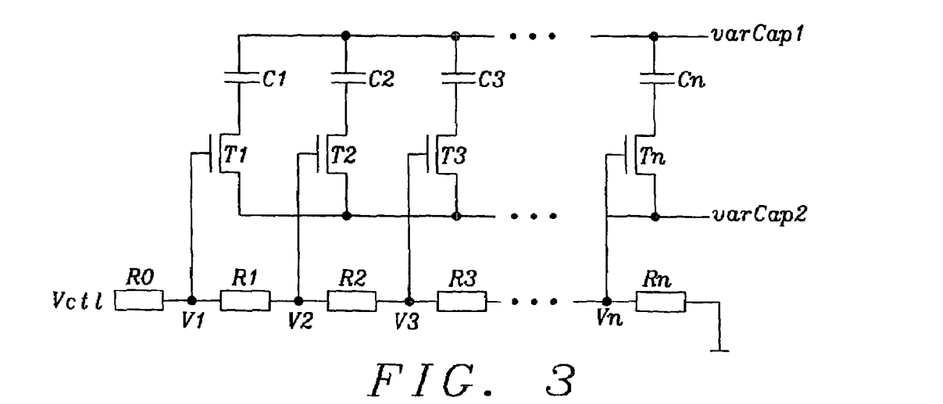
FIG. 3 shows a principal circuit of a switched capacitor chain, controlled through a chain of resistors.
Figure 4A:
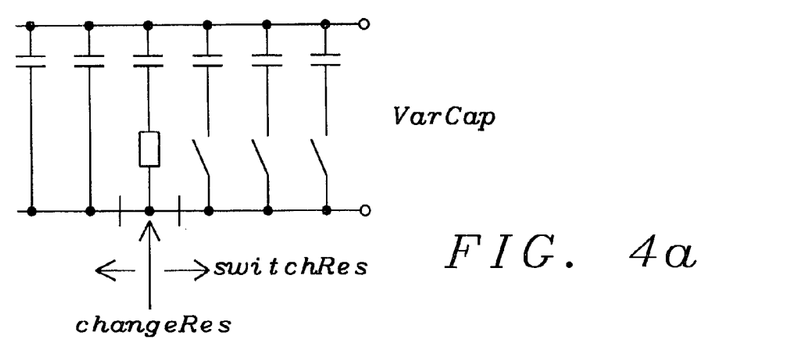
FIG. 4a visualizes the theoretical concept, where only one switch is activated at one time.
Figure 4B:
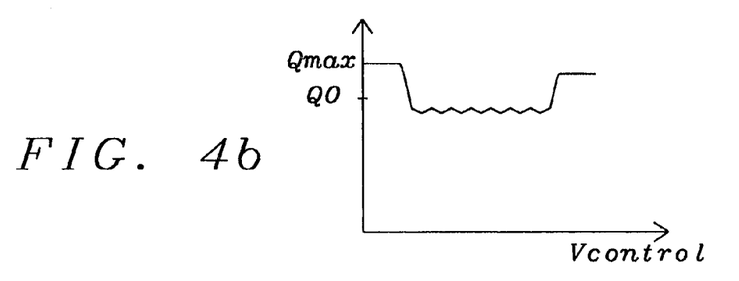
FIG. 4b shows the relation of Q-factor over the tuning voltage for said theoretical concept, where only one switch is activated at one time.

A first solution to linearize the capacitance change is demonstrated in FIG. 3, where a rising control voltage, derived from the tuning voltage input through the resistor chain R0 to Rn, switches on one transistor after the other (T1 to Tn), thus switching capacitors C1 to Cn in parallel. Only few (ideally only one) of said transistors are operating in their active transition phase. Ideally all other transistors are either fully off, i.e. RDSoff very high or the transistor is fully on, i.e. RDSon very low. The resulting variable capacitance of the before mentioned arrangement is available between points varCap1 and varCap2. In FIG. 4a, "switching on" the individual capacitors moves along the resistor chain (switchRes) and one transistor changes its resistance from zero to infinity (changeRes). FIG. 4a demonstrates a theoretical optimum, with some switches completely off, only one "switch" in an actual resistive state and all other remaining switches completely on. The resulting capacitance is varCap. Even with such theoretical optimum arrangement, the resistance of the active switch causes Q-factor to degrade, which is shown in FIG. 4b. However, with real transistors, deviating from said theoretical ideal arrangement of switches (as shown in FIG. 4a), where RDSon is not zero and RDSoff is not infinite, Q-factor is further degraded considerably.

Figure 5A:
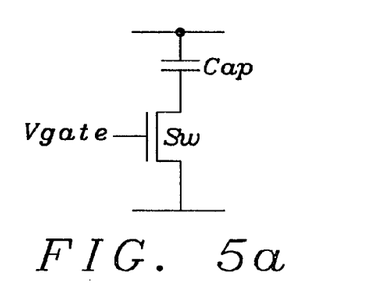
FIG. 5a shows a simplified circuit of a single capacitor switching stage.
Figure 5B:
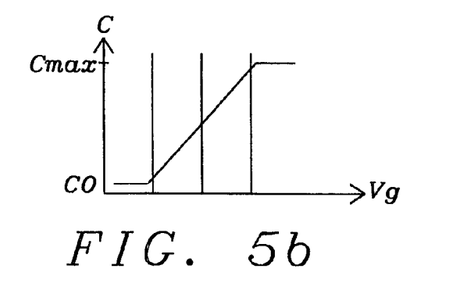
FIG. 5b shows the capacitance versus control voltage characteristics of said single capacitor switching stage.
Figure 5C:
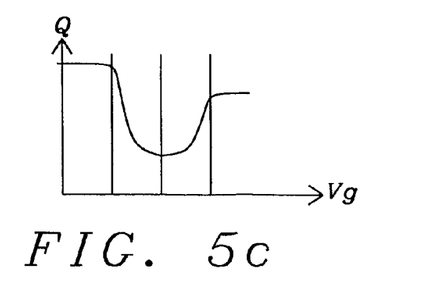
FIG. 5c shows the Q-factor versus control voltage characteristics of said single capacitor switching stage.

A single capacitor switching device, with Vg as the gate voltage to linearly control said switch as shown in FIG. 5a, has a capacitance C versus control voltage Vg characteristic as shown in FIG. 5b. The Q-factor Q versus control voltage Vg characteristic of such single switching device is shown in FIG. 5c.

Figure 6A:
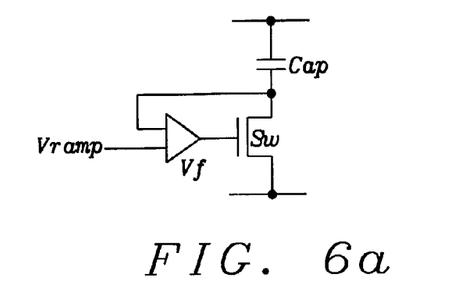
FIG. 6a shows a simplified circuit of a single capacitor switching stage with a voltage follower circuit added.
Figure 6B:
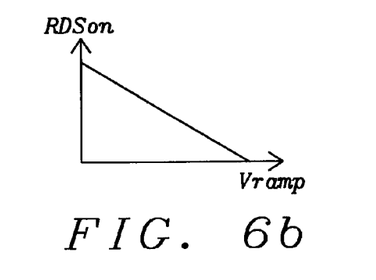
FIG. 6b shows the RDSon characteristic of said single capacitor switching stage with the added voltage follower circuit.

A second solution according to the objectives of this invention, improves the circuit by introducing a voltage follower circuit Vf into the circuit of the first solution, as shown in FIG. 6a. For a single stage RDSon is forced to a linear mode of operation following Vramp through the whole working range between the power supply lines. The resulting RDSon versus the control voltage Vramp is shown in FIG. 6b.

Figure 7:
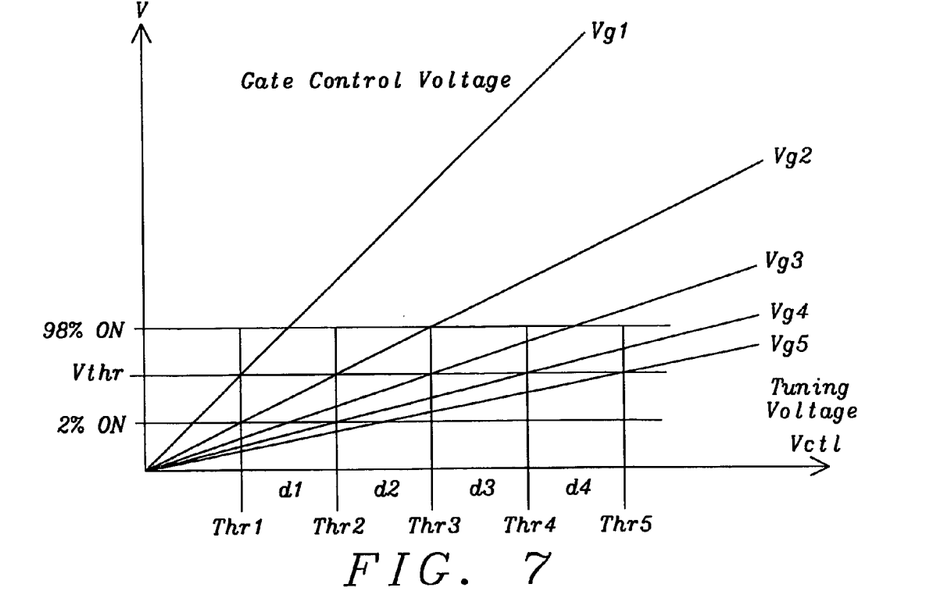
FIG. 7 shows the gate voltage versus tuning voltage relation for the series of capacitor switching stages, according to FIG. 3.

When a capacitor tuning voltage is applied to the circuit of FIG. 3, the gate voltage V1 to Vn of each individual switching device changes with a fraction of said tuning voltage, as visualized with lines Vg1 to Vg5 of FIG. 7. The threshold points are marked Th1 to Th5 in FIG. 7 and the distance between threshold points are marked d1 to d5. A linear characteristic of the capacitance change is achieved when the resistors in said resistor chain in the circuit of FIG. 3 are dimensioned to get threshold points with equal distance, i.e. when all threshold distances, symbolized as d1 to dn in FIG. 7, are identical. In a circuit of FIG. 3, implementing a switching device as of FIG. 5a or FIG. 6a, the envisioned threshold voltages of 2% ON and of 98% ON shown in FIG. 7 are in reality provided by the inherent switching characteristic of the switching devices implemented.

Figure 8:
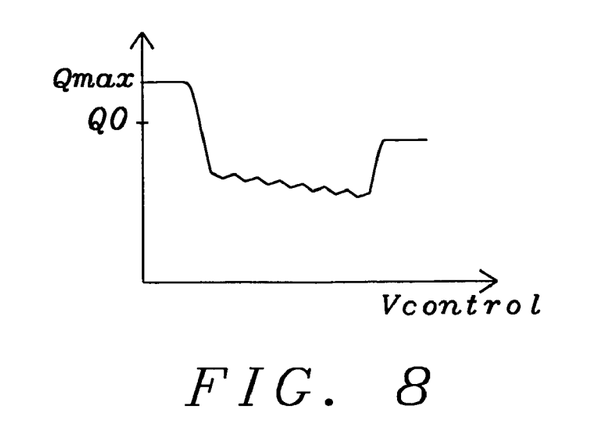
FIG. 8 shows the Q-factor versus tuning voltage for the series of capacitor switching stages, according to FIG. 3.

In a circuit that produces the individual control voltages for said capacitor switching devices with a mechanism similar to the resistor chain of FIG. 3, the next capacitor switching device in one stage starts to ramp up before the capacitor switching device in the previous stage reaches its endpoint. The ramps of both stages will therefore overlap. Said overlap, that increases with rising tuning voltage, will cause more and more switching devices to operate in their active working range, and as a result the Q-factor decreases continuously. The Q-factor degrading is shown in FIG. 8. Said increasing overlapping applies to a circuit according to FIG. 3, using the simple switching device of FIG. 5a, and very similar applies to a circuit with voltage followers in the signal path, as of FIG. 6a.

Figure 9A:
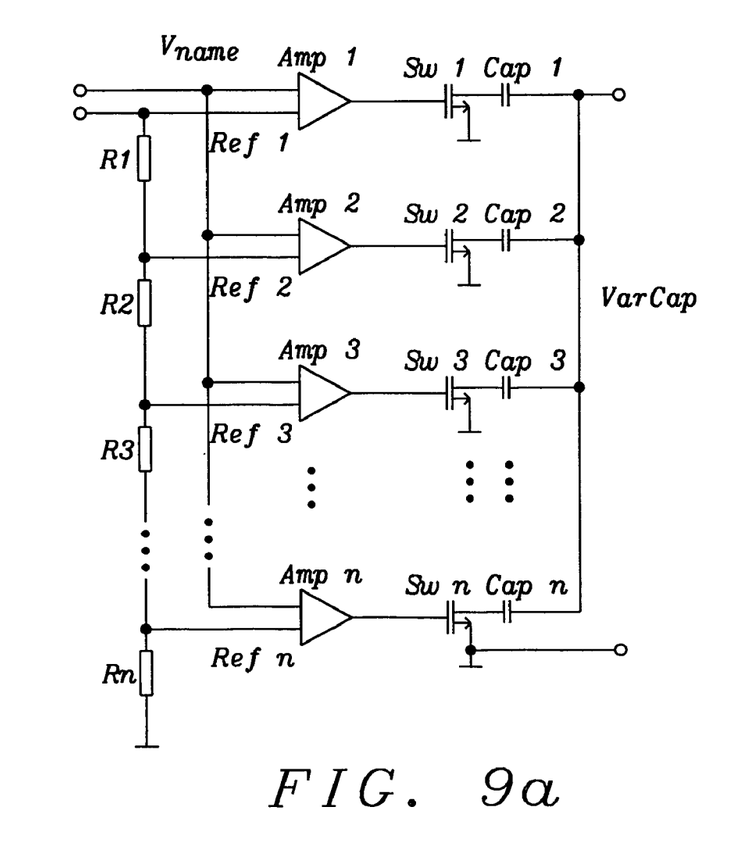
FIG. 9a shows a circuit with operational amplifiers in the control signal path and with an alternative threshold circuit.
Figure 9B:
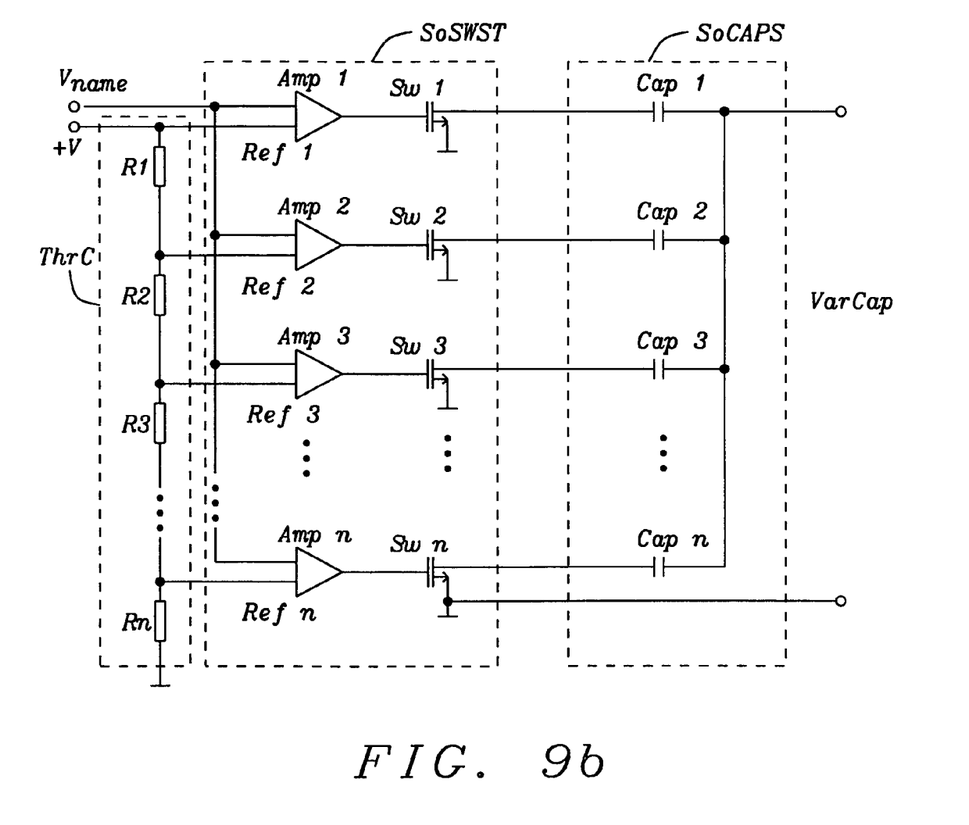
FIG. 9b shows the same circuit as FIG. 9a, additionally marking the areas of the Threshold Circuit, the Set of Switching Stages and the Set of Capacitors.

In a third solution, a major improvement is achieved, by introducing an operational amplifier into the signal path, one for each capacitor-switching stage. Further, the arrangement of the threshold circuit is considerably improved. A resistor chain, or a similar circuit, produces a series of voltage references, used as threshold values, and each of said operational amplifiers compares the tuning voltage input with its dedicated threshold value. FIG. 9a shows a principal diagram of such circuit. Amp 1 to Amp n are said operational amplifiers, Sw 1 to Sw n are the switching devices and Cap 1 to Cap n are said capacitors that will be switched in parallel. R1 to Rn build the resistor chain to produce references voltages Ref 1 to Ref n. The resulting variable capacitance is available at the output points varCap. FIG. 9b identifies the major circuit sections within the circuit of FIG. 9a: the Threshold Circuit is marked ThrC, the Set of Switching Stages is marked SoSWST and the Set of Capacitors is marked SoCAPS.

While said switching transistor is kept within its active switching range (RDS changing mode) the resistance of the transistor linearly follows the input difference of said operational amplifier. Said operational amplifiers give all freedom in circuit dimensioning to decide on the preferred threshold values and steepness of the switching ramp.

Figure 10A:
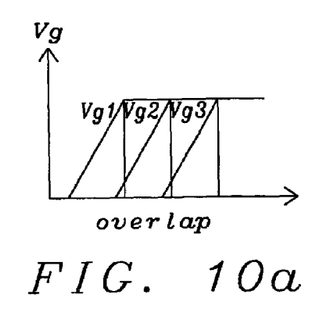
Figure 10B:
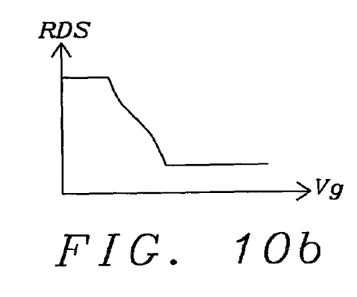
Figure 11:
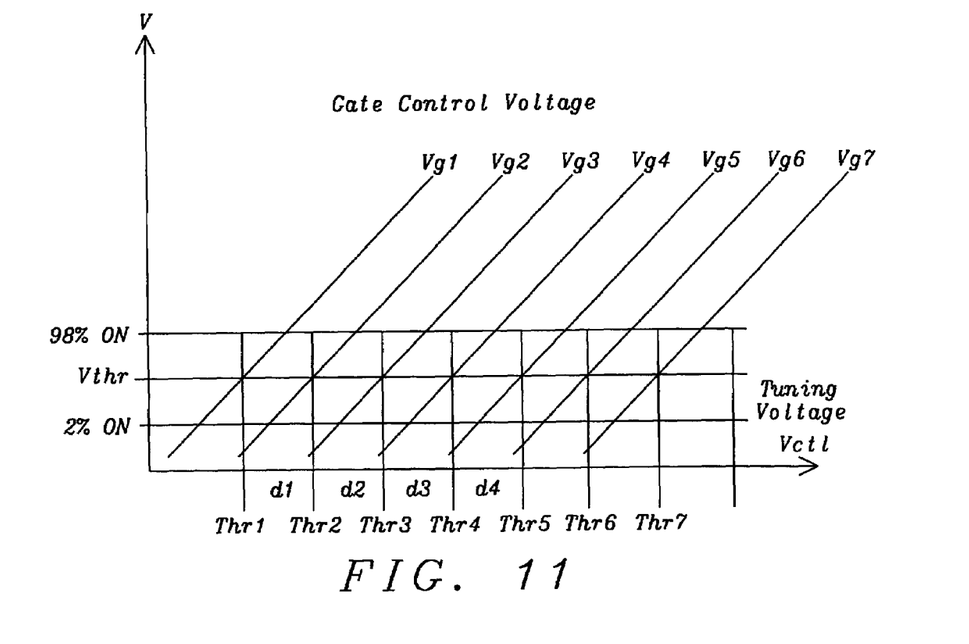

The switching slopes at adjacent capacitor switching stages need to slightly overlap to get a smooth linear capacitance curve, as shown in FIG. 10a. FIG. 10b visualizes the principal RDSon characteristic versus gate voltage of a single capacitor switching stage according to FIG. 9a. A more detailed view on the individual ramp-up functions at the switching transistor's gate is shown in FIG. 11. Vg1 to Vg7 are the gate voltage versus tuning voltage slope of the switching stages number 1 to 7 in this example. One can assume the active area of RDS changing to be between the 2% point and the 98% point. Compared to the characteristic of FIG. 7, all slopes of the individual gate voltages in FIG. 11 are strictly parallel, which makes it easier to achieve the goal of linearity in the capacitor variation. Threshold points Th1 to Th7 in FIG. 11 are equally spaced (distances d1 to d7 in FIG. 11).

Figure 12A:
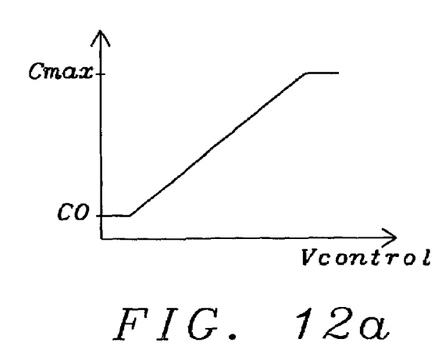
Figure 12B:
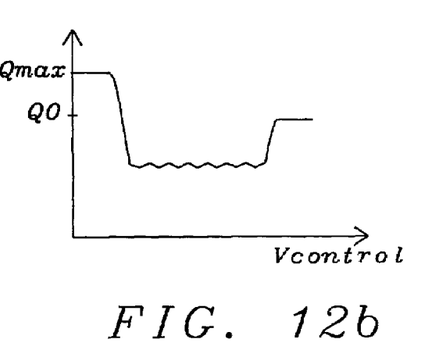

A typical capacitance variation versus tuning voltage is shown in FIG. 12a and the corresponding Q-factor versus tuning voltage is shown in FIG. 12b.

Figure 13:
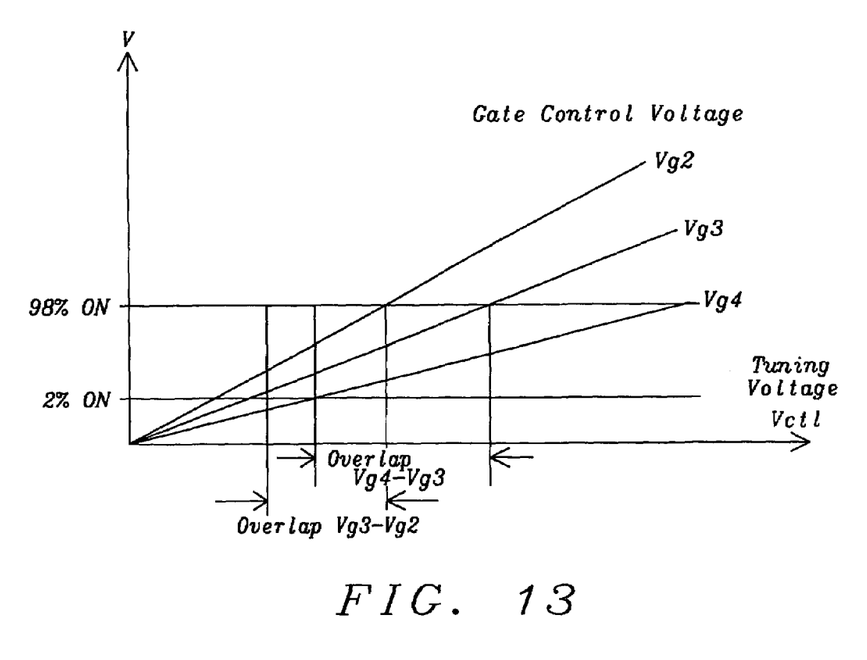
FIG. 13 visualizes the overlapping switching operations of just 3 stages of the circuit according to FIG. 3.

FIG. 13 visualizes the overlapping switching operations of just 3 stages of the circuit according to FIG. 3. Vg2, Vg3 and Vg4 are the gate voltages of the 3 selected switching stages. Overlap Vg3-Vg2 is a measure, where Vg3 just starts to switch on stage number 3 and where Vg2 is still in the active working range for stage number 2. Similar, Overlap Vg3-Vg2 is a measure for the overlapping operation of switching stages number 4 and 3.

Figure 14:
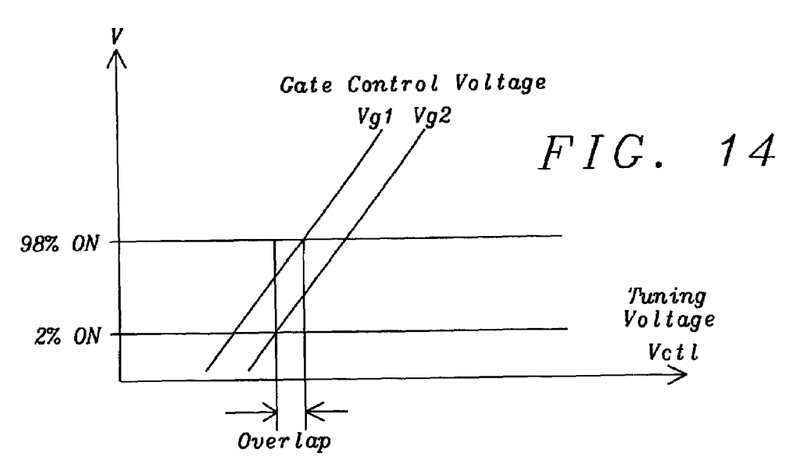

FIG. 14 visualizes the overlapping switching operations of just 2 stages of the circuit according to FIG. 9a. Overlap is a measure, where Vg2 just starts to switch on stage number 2 and where Vg1 is still in the active working range for stage number 1. Because said gate voltage versus tuning voltage slopes are all in parallel, all overlaps are the same.

Figure 15A:
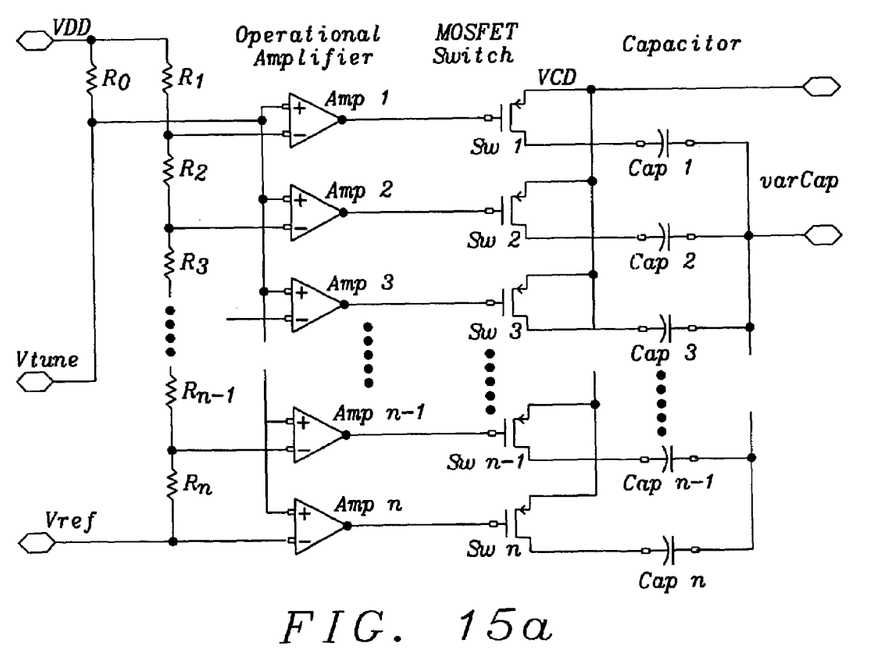
FIG. 15a shows a realistic circuit diagram of an implementation, in accordance with an embodiment of this invention.

A major advantage of the circuit of FIG. 9a, which uses operational amplifiers to compare tuning voltage to an individual threshold voltage is, that all slopes of the gate control voltage and therefore the slopes of the RDSon variation are identical for all capacitance switching stages. Said slopes of the gate control voltage are shown in FIG. 14. In contrast to this, the slopes of the gate control voltage in a circuit, where a circuit produces the individual control voltages for said capacitor switching devices with a mechanism similar to the resistor chain of FIG. 3, all of said slopes are different. FIG. 13 shows this typical behavior for the slopes of 3 neighboring stages FIG. 15a shows a realistic circuit diagram of an implementation, in accordance with an embodiment of this invention. Amp 1 to Amp n are said operational amplifiers, Sw 1 to Sw n are the switching devices and Cap 1 to Cap n are said capacitors that will be switched in parallel, resulting in the total capacitance varCap. R1 to Rn build the resistor chain to produce references voltages for the operational amplifiers of each stage, as already shown in FIG. 9a.

Figure 15B:
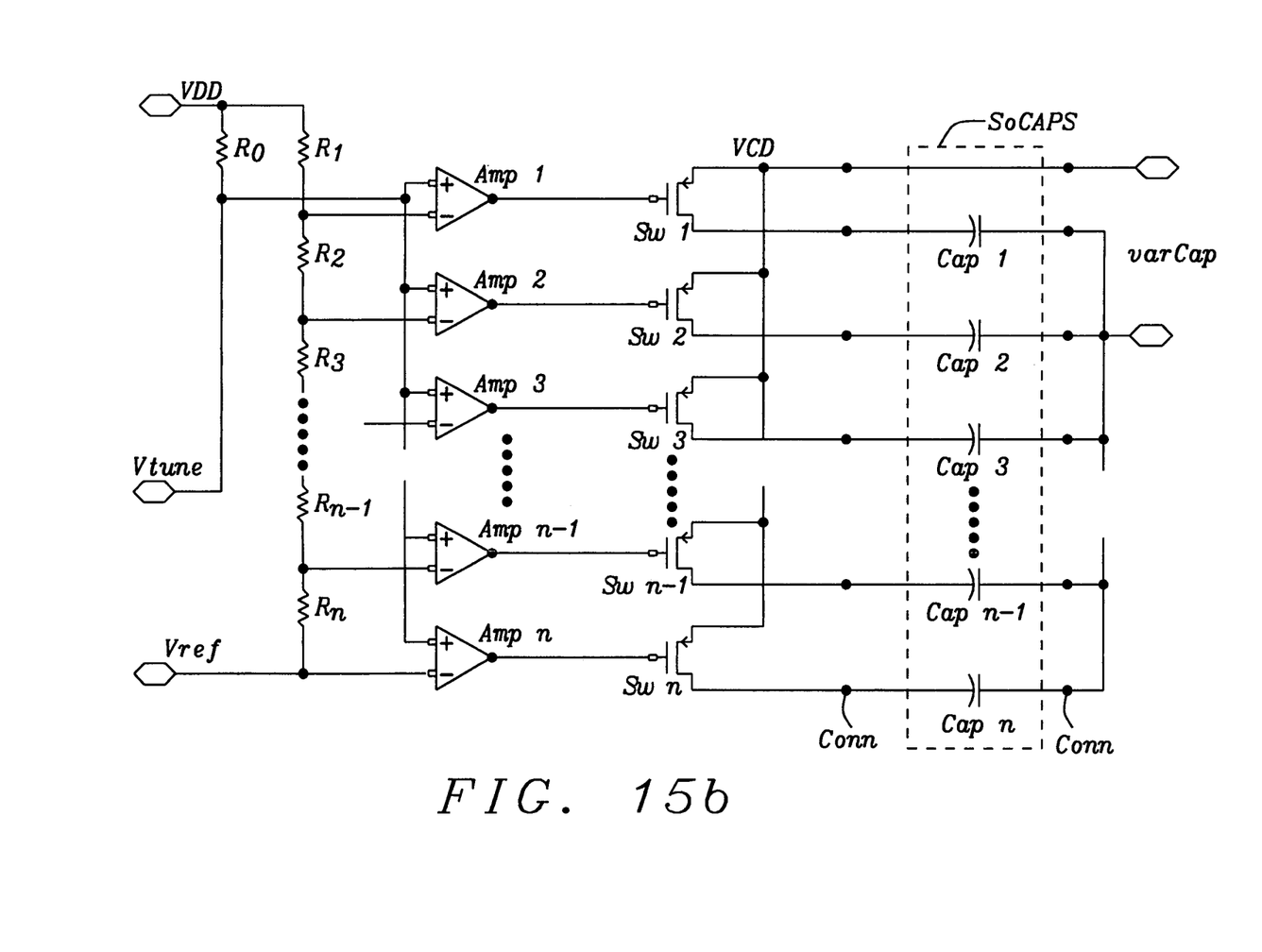
FIG. 15b shows the same circuit as in FIG. 15a, marking the circuit section of the Set of Capacitors, which could be implemented on a separate circuit carrier.

In accordance with the objectives of this invention, a set of individual capacitors is implemented. FIG. 15a suggests, said set of capacitors could be integrated together with the capacitor switching stages on the same semiconductor substrate. However, such capacitors Cap 1 to Cap n could, for example, be discrete metal or polymer capacitors, on a common planar carrier or they could be integrated on their own semiconductor substrate, which is separate from the semiconductor substrate of said capacitor switching stages. Manufacturing the capacitors in a different process than by integrating the capacitances together with the switch control circuit on the same semiconductor substrate, could lead to significant better quality of the capacitors. The circuit sections of said Set of Capacitors, that could be produced on a separate carrier. is marked SoCAPS on FIG. 15b; said separate carrier then connects to the remainder of the whole circuit through the connectors Conn.

The advantage of a capacitor not being of the junction (diode) type capacitor is the invariance due to voltage or temperature change at the capacitor. The switching device is typically a FET transistor, which could be for example a P-channel or N-channel junction FET or a PMOS or NMOS FET.

Figure 16:
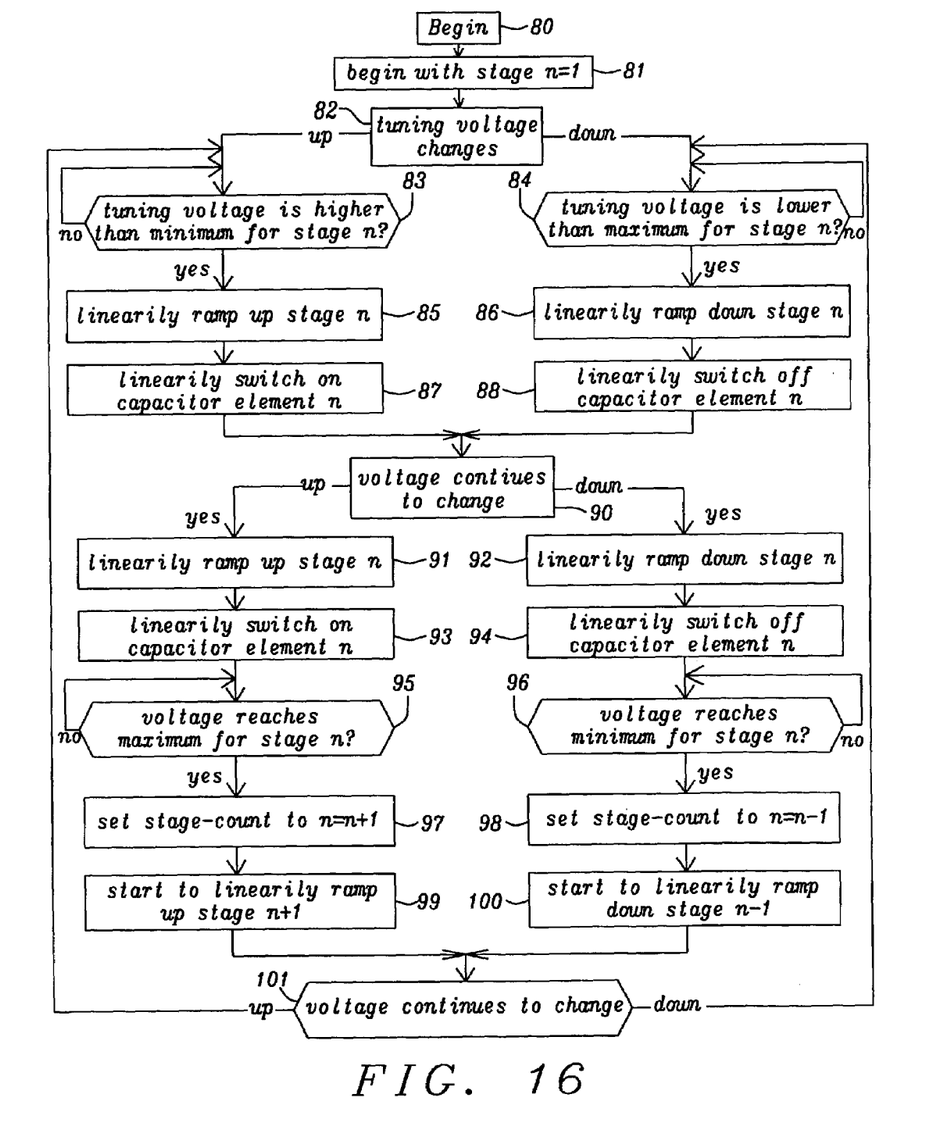
FIG. 16 visualizes the methods to control the capacitance of a variable capacitor in a linear mode through a tuning voltage and achieving a high Q-factor.

The method to achieve the objectives of this invention is illustrated in FIG. 16. First (80), it starts with just the first capacitor, i.e. the count n=1 (81). When the tuning voltage is rising (82) or is high enough (83), the amplifier ramps up (85) and the switching device linearly switches on capacitor element n (87). If the tuning voltage continues to rise (90) the amplifier continues to ramp up (91). If however the tuning voltage turns down (90), the amplifier will ramp down as well (92). Once the tuning voltage reaches the upper limit of the active switching area (95), the process ideally continues with the next step n=n+1 (97)(99). Depending on the direction of continued voltage change (101) it continues to ramp up or down. In case tuning voltage is lower than maximum for stage n (84), the amplifier ramps down (86) and the switching device linearly switches on capacitor element n (88). Once the tuning voltage reaches the lower limit of the active switching area (96), the process ideally continues with the next step n=n+1 (98)(100). Again, depending on the direction of continued voltage change (101) it continues to ramp up or down and restarts at (82).

While the invention has been particularly shown and described with reference to the preferred embodiments thereof, it will be understood by those skilled in the art that various changes in form and details may be made without departing from the spirit and scope of the invention.

What is claimed is:

1. A variable capacitor circuit to control the capacitance of a variable capacitor in a linear mode through a tuning voltage and to achieve a high Q-factor at the same time; comprising:
   a set of individual small capacitors;
   a set of capacitor switching stages, each stage comprising:
      a switching device allowing a steady ramp-up/ramp-down phase between the points of being fully switched on and fully switched off, and where said switching device is connected in series with one of said small capacitors;
      a switch control circuit to control the switching operation of said switching device in a steady ramp-up/ramp-down manner by generating a controlling signal, directly depending on a tuning voltage input, one for each of said capacitor switching stages;
   a threshold circuit to generate a set of threshold values, one for each of said capacitor switching stages; and
   a circuit to provide said tuning voltage, dedicated for the voltage controlled capacitance change.

2. The circuit of claim 1 wherein said capacitors are discrete capacitor components.

3. The circuit of claim 1 wherein said capacitors are manufactured on planar carrier.

4. The circuit of claim 1 wherein said capacitors are integrated on a semiconductor substrate, but on a separate substrate than said capacitor switching stages.

5. The circuit of claim 1 wherein said capacitors are integrated on a semiconductor substrate and on the same substrate as said capacitor switching stages.

6. The circuit of claim 1 wherein said capacitors are manufactured as a Metal-Oxide structure.

7. The circuit of claim 1 wherein said capacitors are manufactured as a junction capacitor.

8. The circuit of claim 1 wherein said switching device is a transistor.

9. The circuit of claim 8 wherein said switching device is a P-channel or N-channel junction FET.

10. The circuit of claim 8 wherein said switching device is a PMOS or NMOS FET.

11. The circuit of claim 1 wherein said switch control circuits are connected directly to said tuning voltage circuits.

12. The circuit of claim 1 wherein said switch control circuit uses a voltage follower circuit, which receives its input from said tuning voltage circuit.

13. The circuit of claim 1 wherein said set of tuning voltage circuits, one for each of said capacitor switching stages, is implemented as a chain of resistors.

14. A variable capacitor circuit to control the capacitance of a variable capacitor in a linear mode through a tuning voltage and to achieve a high Q-factor at the same time; comprising:
   a set of individual small capacitors;
   a set of capacitor switching stages; each stage comprising:
      a switching device to allowing a steady ramp-up/ramp-down phase between the points of being fully switched on and fully switched off, and where said switching devices are connected in series with, one of said small capacitors;
      a switch control circuit to control the switching operation of said switching device in a steady ramp-up/ramp-down manner by generating a controlling signal, directly depending on a tuning voltage input; said switch control circuit comprising:
         an (operational) amplifier to produce a linear control signal for said steady ramp-up/ramp-down switching operation;
      a set of threshold circuits to generate a set of threshold values, one for each of capacitor switching stages; and
      a circuit to provide said tuning voltage, dedicated for the voltage controlled capacitance change, for all of said amplifier stages.

15. The circuit of claim 14 wherein said set of threshold circuits to generate a set of threshold values, one for each of said capacitor switching stages, is implemented as a chain of resistors.

16. The circuit of claim 14 wherein said circuit to provide a tuning voltage, dedicated for the voltage controlled capacitance change, is a single signal connected to all tuning inputs of said capacitor switching stages.

17. A method to control the capacitance of a variable capacitor in a linear mode through a tuning voltage and to achieve a high Q-factor at the same time generate; comprising:
   providing a set of individual small capacitors, a set of capacitor switching stages, comprising a switching device to connect said capacitors in parallel, a switch control circuit to linearly control the switching operation of said switching device, a set of threshold circuits to generate a set of threshold values, one for each of said capacitor switching stages, and a circuit to provide said tuning voltage, dedicated for the voltage controlled capacitance change, for all of said capacitor switching stages;
   switching on or off one of said switching devices in order to connect one of said small capacitors in parallel to the other capacitors, that are already connected in parallel, connecting in parallel one capacitor after the other;
   controlling the switching operation in a steady ramp-up/ramp-down manner for each of said switching devices, in order to partially switch on said small capacitors;
   generating a set of controlling signals, directly depending on the tuning voltage input, to produce linear control signals for said steady ramp-up/ramp-down switching operation;
   generating a set of threshold values, one for each of said capacitor switching stages; and
   supplying said tuning voltage, dedicated for the voltage controlled capacitance change, to all of said capacitor switching stages.

18. The method of claim 17 wherein generating a set of threshold values, one for each of said capacitor switching stages uses a chain of resistors.

19. The method of claim 17 wherein supplying a tuning voltage, dedicated for the voltage controlled capacitance change, to all of said capacitor switching stages uses a single signal, connected to all tuning inputs of said capacitor switching stages.

20. A method to control the capacitance of a variable capacitor in a linear mode through a tuning voltage and to achieve a high Q-factor at the same time generate; comprising:
   providing a set of individual small capacitors, a set of capacitor switching stages, comprising a switching device to connect said capacitors in parallel, a switch control circuit to linearly control the switching operation of said switching device, each of said switch control circuits comprising an (operational) amplifier to produce a linear control signal for said switching operation, a set of threshold circuits to generate a set of threshold values, one for each of said capacitor switching stages, and a circuit to provide said tuning voltage, dedicated for the voltage controlled capacitance change, for all of said capacitor switching stages;
   switching on or off one of said switching devices in order to connect one of said small capacitors in parallel to the other capacitors, that are already connected in parallel, connecting in parallel one capacitor after the other;
   controlling the switching operation in a steady ramp-up/ramp-down manner for each of said switching devices, in order to partially switch on said small capacitors;
   comparing the difference of the capacitance tuning voltage and the threshold voltage of each capacitor switching stage to produce the linear control signal for said steady ramp-up/ramp-down switching operation;
   generating a set of threshold values, one for each of said capacitor switching stages; and
   supplying a tuning voltage, dedicated for the voltage controlled capacitance change, for all of said capacitor switching stages.

* * * * *